United States Patent [19]

Madden

[11] Patent Number: 4,458,968
[45] Date of Patent: Jul. 10, 1984

[54] INTEGRATED CIRCUIT CHIP CARRIER MOUNTING ARRANGEMENT

[75] Inventor: James J. Madden, Naperville, Ill.

[73] Assignee: AT&T Bell Laboratories, Murray Hill, N.J.

[21] Appl. No.: 395,290

[22] Filed: Jul. 6, 1982

[51] Int. Cl.³ .............................................. H05K 1/12
[52] U.S. Cl. ........................ 339/17 CF; 339/75 M; 339/174; 339/176 M; 174/52 FP
[58] Field of Search .......... 339/17 CF, 75 M, 75 MP, 339/174, 176 M, 176 MP; 174/52 FP

[56] References Cited

U.S. PATENT DOCUMENTS

| | | | |
|---|---|---|---|
| 3,795,884 | 3/1974 | Kotaka | 339/17 LM |
| 3,960,423 | 6/1976 | Weisenberger | 339/17 M X |
| 4,050,755 | 9/1977 | Hasircoglu | 339/17 M X |
| 4,089,575 | 5/1978 | Grabbe | 339/17 |
| 4,109,378 | 8/1978 | Davies | 339/17 M X |
| 4,130,327 | 12/1978 | Spaulding | 339/176 MP X |
| 4,144,648 | 3/1979 | Grovender | 339/176 MP X |
| 4,334,727 | 6/1982 | Scheingold et al. | 339/176 M X |
| 4,390,220 | 6/1983 | Benasutti | 339/175 C X |

Primary Examiner—Eugene F. Desmond
Assistant Examiner—Steven C. Bishop
Attorney, Agent, or Firm—W. H. Kamstra; R. T. Watland

[57] ABSTRACT

An arrangement for the solderless mounting of a leadless integrated circuit chip carrier (13) on a printed wiring board (10). A contact interface element (20) presents an array of electrically conductive annular springs (27) which electrically connect the contact pads (14) of the chip carrier (13) and the contact pads (15) of the printed wiring board (10) is interposed between the carrier (13) and the board (10). The interface element (20) is fitted about a locating block (32) affixed to the board (10), the block (32) having a central aperture (33) dimensioned to freely admit a central pin (36) extending from the underside of the chip carrier (13). The latter component is held in place by a retaining ring (39) frictionally fitted to the pin (36) and operating against a collar (37) through which the pin (36) also passes, which collar (37) is press-fitted into the locating block (32).

5 Claims, 3 Drawing Figures

INTEGRATED CIRCUIT CHIP CARRIER MOUNTING ARRANGEMENT

TECHNICAL FIELD

This invention relates to electrical integrated circuit chips and more particularly to apparatus for electrically interconnecting such chips and the circuitry of a printed wiring board and the like.

BACKGROUND OF THE INVENTION

The fabrication of many electrical circuits and circuit elements integrally on a single silicon chip has long been known in the art. The chips themselves are retained on a ceramic substrate or carrier from which external electrical connections are made, in one known leadless type, from conductive contact pads arranged about its rectangular periphery. The chip carrier contact pads may be and have been affixed directly to printed wiring board circuitry by soldering, for example. This arrangement has a number of advantages including reduced circuit path lengths and thereby, a reduction in lead inductance. The mounting is, however, more or less permanent; when a chip carrier is to be replaced, the solder joints must be melted and a new carrier must be resoldered in place. The relatively high temperatures required for the occasional chip carrier replacement tend to degrade the life of both the chip and the printed wiring board. For this and other reasons and to provide for the ready removal of a chip carrier, sockets have frequently been introduced into which the carrier may be removably fitted. Such an arrangement is shown, for example, in the patent of D. G. Grabbe, U.S. Pat. No. 4,089,575, issued May 16, 1978. A socket having internal contacts is provided which contacts are permanently soldered to the printed wiring board circuitry. A chip carrier having corresponding external contacts is then fitted into the socket, the contacts of both components making frictional engagement to achieve the electrical interconnections. In this arrangement as well as others, the external chip carrier contacts and the internal mating socket contacts add to the external measurements of the socket which in turn reduces the number of such sockets which may be mounted on a given printed wiring board. A further consideration as mentioned is the fact that the contacts of the socket are still permanently soldered to the circuitry of the wiring board with any attendant ill effects the high temperature may have on the board. It is accordingly an objective of the chip carrier mounting arrangement of the invention to achieve significant reduction in the area of a wiring board occupied by the carrier and the length of the connecting leads and to permit ready removal and replacement of the carrier and associated contacts.

SUMMARY OF THE INVENTION

The foregoing and other objectives are realized in one illustrative integrated circuit (IC) chip mounting arrangement according to the invention which electrically interconnects a rectangular pattern of electrically conductive contact pads affixed to the surface of a printed wiring board and a corresponding rectangular arrangement of similar contact pads presented on the underside of an IC chip carrier. The contact pads of the board are conventionally connected to the board printed circuitry, the pads of the carrier terminating the integrated circuitry of the chip. The interconnection is accomplished by a contact interface element of the character disclosed in the copending application of the present inventor, Ser. No. 395,291, filed July 6, 1982, (J. J. Madden Case 11). The interface element is interposed between the chip carrier and the board contact pads, the interface element having a rectangular array of electrically conductive annular springs presented about its periphery, the array of springs corresponding to the patterns of contact pads of the wiring board and of the chip carrier. After assembly, lower arc portions of the annular springs make contact with respective corresponding contact pads of the printed wiring board and upper arc portions of the annular springs make contact with respective corresponding contact pads on the underside of the chip carrier. The chip carrier is positioned by a central platform formed on its underside which is fitted in a rectangular opening in the interface element and is held in place by a central pin extending from its underside through a retaining ring where it is frictionally secured in a mounting structure affixed to the board.

BRIEF DESCRIPTION OF THE DRAWING

The organization of an integrated chip carrier mounting arrangement according to the principles of the invention together with its features will be better understood from a consideration of the detailed description of one illustrative embodiment thereof which follows when taken in conjunction with the accompanying drawing in which.

DETAILED DESCRIPTION

Figure 1:
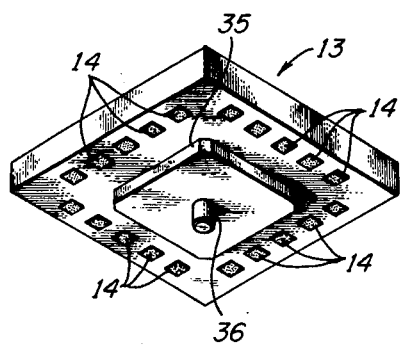
FIG. 1 is an exploded, perspective view of the components of an illustrative chip carrier mounting arrangement according to the invention.
Figure 1:
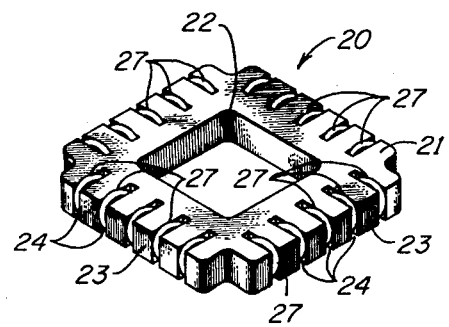
Figure 1:
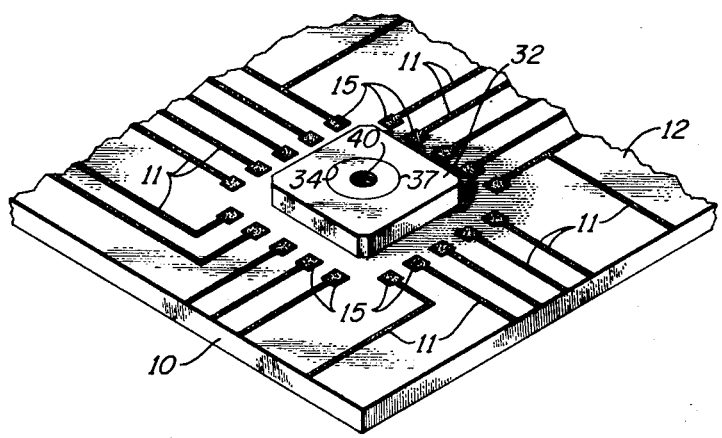

Components of an illustrative integrated circuit chip carrier mounting arrangement according to the invention shown in exploded view in FIG. 1 include a typical printed wiring board 10 having printed wiring 11 affixed to a surface 12 thereof to which wiring 11 a chip carrier 13 shown will ultimately be electrically connected. Chip carrier 13 is of the leadless type well-known in the art and retains within it the integrated circuit silicon chips to be connected to the printed wiring board 10 circuitry. The connections are made from electrically conductive contact pads 14 arranged on the underside of chip carrier 13 about its rectangular perimeter. A corresponding rectangular array of electrically conductive contact pads 15 terminate particular circuits of printed wiring 11 of board 10.

Figure 2:
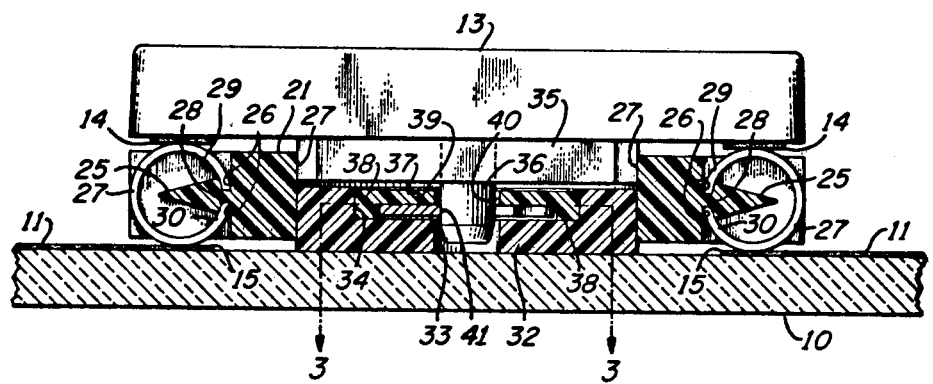
FIG. 2 is an enlarged sectional view of the assembled components of FIG. 1 showing particularly the details of the contact interface component employed in the assembly.
Figure 3:
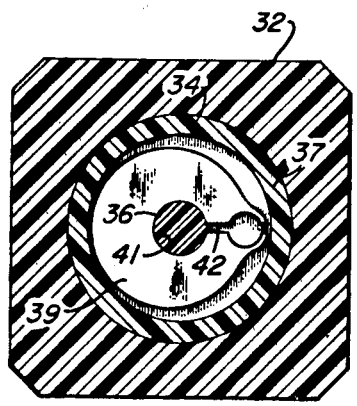
FIG. 3 is a cross-sectional view of the chip carrier retaining structure, the section being taken along the line 3—3 of the view of FIG. 2 in the direction indicated.

Electrical interconnection is accomplished by a contact interface element 20 of the character described in the copending application referred to hereinbefore which comprises a rectangular insulative frame 21 having a central rectangular opening 22. Element 20 presents four perpendicular faces 23 each of which has a plurality of equally spaced slots 24 formed therein. Slots 24 are spaced to correspond to the spacings of contact pads 14 of chip carrier 13 and to the spacings of contact pads 15 of printed wiring board 10. As shown in the enlarged section view of FIG. 2, which is taken along the centers of opposite slots 24, each slot 24 has formed within and across it a wedge 25 having its apex directed toward the outer face of interface element 20. Each of the wedges 25 is oppositely notched at its base and at the base of a slot 24 to form a pair of opposite indents 26. The assemblage of interface element 20 is completed by the insertion in each of the slots 24 of an electrically conductive annular spring 27. Although a circular cross section is assumed in the illustrative embodiment being described, spring 27 may be of any suitable form and is disjoined to present a small gap 28 and two open ends 29 and 30. Springs 27 are dimensioned to fit snugly within slots 24 into which they are fitted during assembly by urging the open gap 28 onto wedges 25 thereby opening gap 28 until ends 29 and 30 of springs 27 are seated into indents 26. Springs 27 are then retained in place by spring action. The diameter of each of springs 27 is determined so that an arc portion thereof extends beyond the upper and lower surface of frame 21. According to the invention, a novel means for securing the chip carrier 13 and contact interface element 20 in place on printed wiring board 10 is provided which comprises a rectangular locating block 32 (See also FIGS. 1 and 3) which may be secured by a suitable adhesive to the surface of board 10 with particular regard for the spacings and locations of its contact pads 15. Block 32, which may be of any suitable material, has a central circular aperture 33 formed therethrough and a larger, circular opening 34 formed partially therethrough. Block 32 is dimensioned with respect to rectangular opening 22 of interface element 20 so that the latter element may be slip-fitted partially about block 32 (See FIG. 2). A second locating block 35, also of a suitable material, is affixed to the underside of chip carrier 13 also with particular regard for the spacings and locations of its contact pads 14 and is dimensioned for slip-fitting in the rectangular opening 22 of contact interface element 20. Locating block 35 has centrally extending therefrom a pin 36 the diameter of which is determined for a free admittance in aperture 33 of locating block 32.

A further element of the mounting apparatus is a circular collar 37 of a suitable material having a downward directed peripheral flange 38. Collar 37 is dimensioned for a press-fit in circular opening 34 of locating block 32 and has a central aperture 40 dimensioned to freely admit pin 36 of locating block 35. Before collar 37 is press-fitted in opening 34, a retaining ring 39 is freely fitted within flange 38 and is positioned by the latter as collar 37 is forced into opening 34 until the surface of flange 38 is seated on the surface of opening 34. Ring 39 is provided with a circular aperture 41 of a diameter slightly smaller than the diameter of pin 36 and is disjoined to present a small gap 42. After the press-fit of collar 37, chip carrier 13 is positioned above the assembly so far described so that its pin 36 is aligned with aperture 40 of collar 37 and aperture 41 of retaining ring 39. Carrier 13 is then urged downward as viewed in the drawing so that its pin 36 is forced into aperture 41 of ring 39, the latter aperture enlarging to receive pin 36 where it is frictionally held. Sufficient clearance is provided between the under surface of locating block 35 and the upper surfaces of block 32 and collar 37 so that, as chip carrier 13 is fitted, its contact pads 14 exert sufficient pressure on corresponding rings 27 to slightly compress the latter. Positive electrical contact is thus ensured between rings 27 and contact pads 14 and pads 15 of board 10. Advantageously, chip carrier 13 is thus mounted on board 10 without the need for an external socket thereby decreasing the board area required for its mounting. Chip carrier 13 is readily pried from its mounting, by overcoming the friction forces exerted by retaining ring 39 on pin 36.

What has been described is considered to be only one illustrative chip carrier mounting arrangement according to the principles of the invention. It is thus to be understood that various and numerous other arrangements may be devised by one skilled in the art without departing from the spirit and scope of the invention as defined only by the accompanying claims.

What is claimed is:

1. A mounting arrangement for mounting an integrated circuit chip carrier on a printed wiring board comprising a locating block having a central aperture affixed to said board, a contact interface element fitted about said block, said element retaining an array of electrically conductive annular springs, first arc portions of said springs making electrical contact with corresponding electrical contact pads on said printed wiring board, said springs being positioned so that second, opposite arc portions of said springs can make electrical contact with corresponding contact pads of said chip carrier, and means for securing said carrier to said board comprising a pin extending from said carrier, a collar fitted about said pin maintained on a surface of said locating block, and a retaining ring frictionally fitted about said pin between a surface of said collar and said surface of said locating block.

2. A mounting arrangement as claimed in claim 1 in which said interface element is rectangular in form and said array of annular springs comprises a plurality of said springs arranged on opposite sides of said rectangular interface element.

3. An electrical interconnection assembly comprising a printed wiring board having a first array of electrical contact pads and a locating block having a central aperture and a recess formed therein on a surface thereof, a contact interface element fitted about said locating block, said element retaining an array of electrically conductive annular springs corresponding to said first array of contact pads, first arc portions of said springs being in electrical contact with respective contact pads of said first array of contact pads, an integrated circuit chip carrier having a second array of electrical contact pads corresponding to said first array of contact pads and a pin extending from an under surface thereof into said aperture of said locating block, said contact pads of said second array of contact pads being in electrical contact with respective second arc portions of said springs of said array of annular springs and means for securing said chip carrier in place comprising a collar fitted about said pin maintained on a surface of said locating block and a retaining ring frictionally fitted about said pin between an under surface of said collar and said surface of said locating block.

4. Apparatus for electrically interconnecting a first array of electrical contact pads on a printed wiring board and a second array of electrical contact pads of an integrated circuit chip carrier having a pin extending from an under surface thereof, said apparatus comprising a locating block affixed to said board having an aperture dimensioned to freely admit said pin, a retaining frame fitted about said block, an array of electrically conductive annular springs retained on the periphery of said frame, said springs being positioned so that first arc portions of said springs make electrical contact with contact pads of said first array of contact pads and so that second arc portions of said springs can make electrical contact with contact pads of said second array of contact pads of a chip carrier, and means for securing said chip carrier in place when said chip carrier is mounted on said board comprising a collar having an aperture dimensioned to admit said pin fitted in a recess of said locating block and a retaining ring between said collar and said block, said ring having an aperture dimensioned to frictionally clasp said pin when said chip carrier is mounted on said board.

5. Apparatus as claimed in claim 4 in which said retaining frame is rectangular and in which said array of annular springs comprises at least a first and a second plurality of said springs arranged on opposite sides of said frame.

* * * * *